United States Patent [19]
Gamo

[11] Patent Number: 6,011,451
[45] Date of Patent: Jan. 4, 2000

[54] CHIP TYPE PIEZOELECTRIC FILTER HAVING INTERNAL COMMON ELECTRODES OR A SHIELD ELECTRODE

[75] Inventor: Masao Gamo, Takaoka, Japan

[73] Assignee: Murata Manufacturing Co., Ltd., Kyoto, Japan

[21] Appl. No.: 09/050,546

[22] Filed: Mar. 30, 1998

[30]    Foreign Application Priority Data

Apr. 1, 1997  [JP]  Japan ................................. 9-083005
Dec. 26, 1997 [JP]  Japan ................................. 9-360512

[51] Int. Cl.⁷ ............................. H03H 9/58; H03H 9/05
[52] U.S. Cl. ..................... 333/189; 333/187; 310/349; 310/366
[58] Field of Search .................... 333/187–192; 310/321, 340, 349, 345, 348, 351–353, 365–368

[56]    References Cited

FOREIGN PATENT DOCUMENTS

| | | |
|---|---|---|
| 59-159026 | 10/1984 | Japan . |
| 59-164329 | 11/1984 | Japan . |
| 62-14512 | 1/1987 | Japan ..................................... 333/191 |
| 62-7213 | 1/1987 | Japan .............................. 333/187 R |
| 3-97314 | 4/1991 | Japan ..................................... 333/191 |
| 4-4603 | 1/1992 | Japan ..................................... 333/191 |
| 5-67943 | 3/1993 | Japan ..................................... 333/190 |
| 5-259805 | 10/1993 | Japan .............................. 333/187 R |
| 6-6175 | 1/1994 | Japan ..................................... 333/191 |

*Primary Examiner*—Robert Pascal
*Assistant Examiner*—Barbara Summons
*Attorney, Agent, or Firm*—Graham & James LLP

[57]    ABSTRACT

A chip type filter reduces a required mount space while facilitating achievement of impedance matching and also enhancing the stability of filter characteristics. The chip type filter includes a first piezoelectric substrate, a filter section with resonance electrodes, a common electrode and a coupling capacitance section, a second piezoelectric substrate, a second filter section with a pair of resonance electrodes, a common electrode opposing the electrodes in a "top/bottom-surface overlap" relationship and a coupling capacitance section. The filter is arranged such that the first and second piezoelectric substrates are adhered to each other with an adhesive layer located therebetween.

16 Claims, 15 Drawing Sheets

CHIP TYPE PIEZOELECTRIC FILTER HAVING INTERNAL COMMON ELECTRODES OR A SHIELD ELECTRODE

BACKGROUND OF THE INVENTION

1. Field of the Invention

The present invention relates to chip type piezoelectric filters having a circuit including a plurality of electrically coupled piezoelectric filter sections, and more particularly, to a chip type piezoelectric filter having a circuit including a first energy trap type piezoelectric filter section and a second energy trap type piezoelectric filter section which are electrically connected to each other via a coupling capacitor.

2. Description of the Prior Art

Conventionally, energy trap type piezoelectric filters have been used as intermediate frequency filters in portable or handheld telephones functioning as mobile telecommunication devices. In the piezoelectric filters of this type, it is required that such filters be arranged as surface-mountable chip components.

For such a purpose, a chip type piezoelectric filter has been proposed which is shown in an exploded perspective view in FIG. 19. As apparent from FIG. 19, a chip type piezoelectric filter 51 includes a piezoelectric substrate 52 which is made of a piezoelectric material, such as lead zirconate titanate (PZT) piezoelectric ceramics. First and second filter sections and a coupling capacitance section are provided on the piezoelectric substrate 52.

More specifically, the first filter section includes a pair of resonance electrodes 53a, 53b disposed on the upper or top surface of the piezoelectric substrate 52. A common electrode (not show) is provided on the lower or bottom surface of the piezoelectric substrate 52. The common electrode on the bottom surface of the substrate 52 opposes the resonance electrodes 53a, 53b such that the resonance electrodes are located on the top surface of substrate 52 whereas the common electrode is on the bottom surface of the substrate 52 to define a "top/bottom-surface overlap" relationship. Similarly, the second filter section includes a pair of resonance electrodes 54a, 54b located on the top surface of piezoelectric substrate 52 while a common electrode (not shown) is disposed on the bottom surface of the substrate 52.

The resonance electrode 53a is connected to a lead electrode 55a which extends along one end portion of the piezoelectric substrate 52. The resonance electrode 54a is connected to a lead electrode 55b extending along the opposite end portion of piezoelectric substrate 52. The lead electrodes 55a, 55b are connected respectively to outer or external electrodes each serving as an input electrode or an output electrode, as will be described later. A capacitance electrode 56a is disposed at a central portion on the top surface of the piezoelectric substrate 52. Similarly, a capacitance electrode of substantially the same size as electrode 56a is disposed on the bottom surface of the substrate 52 in a way such that it opposes the capacitance electrode 56a with the substrate 52 being "sandwiched" therebetween. The capacitance electrode on the bottom surface of the substrate 52 extends up to one side edge of the substrate 52 (for connection with an external electrode 58b on the edge portion). The pair of capacitance electrodes define a capacitor which functions as a coupling capacitance section.

The capacitance electrode 56a is connected to the resonance electrodes 53b, 54b at an edge portion of the top surface of the substrate 52. The capacitance electrode 56a is elongated so as to be located at one long-edge side surface of the piezoelectric substrate 52. A pair of outer substrates 57, 58 are mounted on the opposite surfaces of the piezoelectric substrate 52 and adhered to the substrate 52 via a suitable adhesive. Recess portions 58d (one of which located on the substrate 57 side is not visible in the figure) are formed in the surfaces of outer substrates 57, 58 to form spaces for facilitating vibration of the first and second filter sections. Alternatively, such adhesive used may be coated on selected surface areas of the piezoelectric substrate 52 other than those areas in which the first and second filter sections are located. In another alternative arrangement, more than one recess portion may be formed in the opposing surfaces of the outer substrates 57, 58 and the adhesive may be coated on the inner surfaces of outer substrates 57, 58.

The outer substrate 57 includes external electrodes 57a to 57c. The external electrodes 57a–57c are formed in such a way that each of them extends across the top surface of external substrate 57 to be located along on a pair of opposite long-side edge surfaces thereof. Similarly, the outer substrate 58 includes external electrodes 58a–58c. The external electrodes 58a–58c are formed so that each extends across the bottom surface of external substrate 58 to extend along a pair of long-side edge surfaces thereof.

After lamination, each of the external electrodes 57a–57c is electrically connected to a corresponding one of the external electrodes 58a–58c. Accordingly, the external electrodes 57a, 58a are connected to the lead electrode 55 a for use as the input electrode. Also, the external electrodes 57b, 58b are connected to the capacitance electrode disposed on the bottom surface of the piezoelectric substrate 52. Additionally, the external electrodes 57b, 58b are coupled to ground.

The external electrodes 57c, 58c are electrically connected together and are further connected to the lead electrode 55b for use as the output electrode.

A circuit configuration of the chip type piezoelectric filter 51 arranged as described above is shown in FIG. 20. As apparent from FIG. 20, the chip type piezoelectric filter 51 has a circuit configuration in which the first and second filter sections 53, 54 are connected to each other via the coupling capacitance section 56.

In such a chip type piezoelectric filter 51, the first and second filter sections 53, 54 and its related coupling capacitance section 56 are located on a single piezoelectric substrate 52. As a result of this arrangement, when the filter 51 is surface mounted using external electrodes 57a–58c, the resulting mount space required increases undesirably.

One technique for reducing the surface mount area is to decrease the areas of the resonance electrodes 53a, 53b, 54a, 54b and common electrodes (not shown). However, when the electrode-to-electrode opposing area decreases in the filter section, the electrostatic capacitance decreases in value, causing an increase in the value of the matching impedance.

Furthermore, in cases where the size of the piezoelectric substrate 52 is decreased while the electrode areas are unchanged with respect to the first and second filter sections, the resultant filter characteristics are deteriorated due to the fact that vibration of the first and second filter sections is hindered or suppressed at a portion which is laminated by the adhesive used for connection of the elements.

Accordingly, it has not been possible to decrease the size of such a filter by simply decreasing the electrode area and the dimensions of piezoelectric substrate 52.

SUMMARY OF THE INVENTION

The preferred embodiments of the present invention overcome the disadvantages of the prior art described above by providing a small-size chip type piezoelectric filter which maintains a desired value of matching impedance value while suppressing degradation of filter characteristics thereof even when a surface mount area of the filter is significantly decreased.

The preferred embodiments of the present invention provide a chip type piezoelectric filter including a piezoelectric substrate having a first piezoelectric filter section disposed thereon; a second piezoelectric substrate having a second piezoelectric filter section disposed thereon; a coupling capacitor disposed on at least one of the first and second piezoelectric substrates; wherein the first and second piezoelectric substrates are electrically connected to each other via the coupling capacitor.

With the above described structure of the preferred embodiments of the present invention, the required surface mount area is significantly reduced as compared to the prior art chip type piezoelectric filter even though a circuit configuration thereof includes a plurality of piezoelectric filters connected via a coupling capacitor. Furthermore, the matching impedance is hardly changed by the miniaturization or "down-sizing" of the filter without having to decrease the opposing or overlap area of the electrodes at the piezoelectric filter sections. A filter with such a great decrease in overall size and dimensions has great applicability to electronic equipment of reduced size, such as mobile telephone devices using chip type piezoelectric filters.

In addition, the coupling capacitor is arranged on at least one of the first and second piezoelectric substrates. In other words, the coupling capacitor is arranged on the same substrate together with the piezoelectric filter section whereby any possible difference between the coupling capacitor's temperature characteristics and the piezoelectric filter section's temperature characteristics is reduced or minimized so that the overall temperature characteristics of the chip type piezoelectric filter are also stabilized.

Further, arranging the coupling capacitor on the piezoelectric substrate avoids the need to use any "special" dielectric materials which have an increased dielectricity and high cost for forming the outer substrates which are to be laminated on the first and second piezoelectric substrates. This achieves a reduction in production costs of the chip type piezoelectric filters according to the preferred embodiments of the present invention. Furthermore, since it is possible to choose any material for the outer substrates without having to take into account the amount of dielectricity of such material, the outer substrates may be formed of materials with excellent mechanical characteristics, which enables the chip type piezoelectric filter to exhibit further increased reliability.

In the chip type piezoelectric filter according to the preferred embodiments of the present invention, the coupling capacitor may preferably comprise a pair of capacitance electrodes provided on the top and bottom major surfaces of at least one of the first and second piezoelectric substrates which are arranged to be opposed to each other.

The above described structure makes it possible to easily and accurately provide a coupling capacitor having a sufficient value.

In the chip type piezoelectric filter according to the preferred embodiments of the present invention, each of the first and second piezoelectric filter sections may comprise a pair of resonance electrodes provided on one of the top and bottom major surfaces of the piezoelectric substrate, and a common electrode provided on the other of the top and bottom major surfaces of the piezoelectric substrate so as to oppose each other with the pair of resonance electrodes.

In the chip type piezoelectric filter according to the preferred embodiments of the present invention, the first and second piezoelectric substrates are preferably laminated so that the common electrodes of said first and second piezoelectric filter sections are opposed to each other. This makes it possible to reduce stray capacitance between the first and second piezoelectric filters, which in turn enables achievement of excellent filter characteristics.

The first piezoelectric substrate may further comprise a first shield electrode provided on the major surface on which the common electrode of the first piezoelectric filter section is provided and electrically connected to the common electrode. The second piezoelectric substrate may further comprise a second shield electrode provided on the major surface on which the common electrode of the second piezoelectric filter section is provided and electrically connected to the common electrode. The first and second shield electrodes are partially not opposed to each other in the thickness direction of the first and second piezoelectric substrate. This structure makes it possible to suppress the stray capacitance while simultaneously minimizing an increase in electrical capacitance between input/output signals and the ground, which may advantageously contribute to accomplishment of further improved filter characteristics.

An input/output external electrode and an external electrode connected to the ground may be provided on the outer surface of a laminated body formed by laminating the first and second piezoelectric substrate in the thickness direction thereof. In accordance with one specific aspect of the present invention, the input/output external electrode is connected to one of the resonance electrodes of the first and second piezoelectric filter sections; where the coupling capacitance section is defined by a pair of capacitance electrodes, one capacitance electrode is electrically connected to the external electrode which is in turn electrically connected to ground.

These and other objects, features and advantages of the invention will be apparent from the following more particular description of preferred embodiments of the invention, as illustrated in the accompanying drawings.

DETAILED DESCRIPTION OF PREFERRED EMBODIMENTS

Several chip type piezoelectric filters in accordance with non-limitative preferred embodiments of the present invention will be explained with reference to the accompanying drawings.

Figure 1:
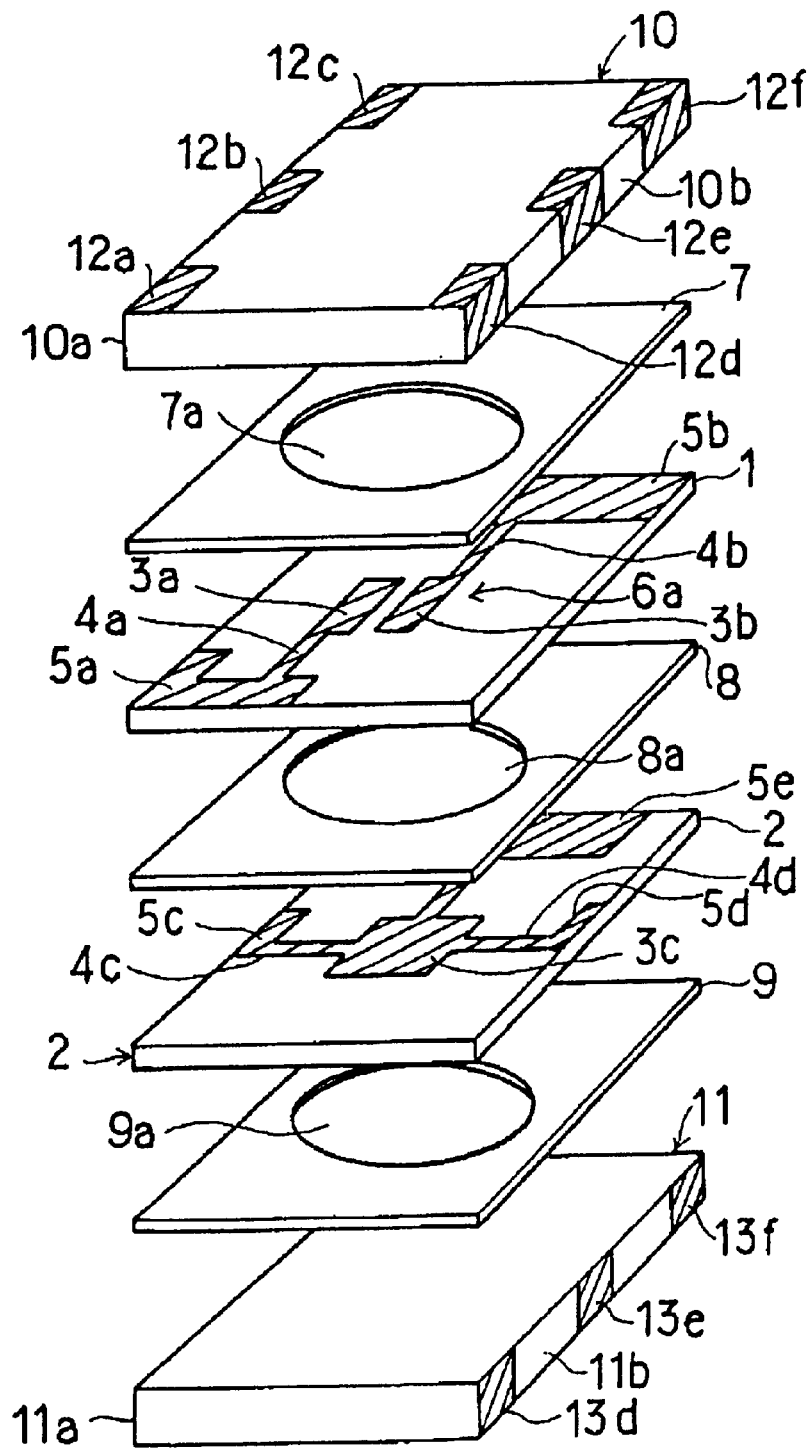
FIG. 1 is a diagram showing an exploded perspective view of a chip type piezoelectric filter in accordance with a preferred embodiment of the present invention.

FIG. 1 is a diagram showing an exploded perspective view of a chip type piezoelectric filter in accordance with one preferred embodiment of the instant invention. The chip type piezoelectric filter embodying the invention includes first and second piezoelectric substrates 1, 2 preferably having a substantially rectangular plate shape. The first and second piezoelectric substrates 1, 2 may be made of either lead zirconate titanate (PZT) piezoelectric ceramics or piezoelectric single-crystals such as quartz. In this preferred embodiment shown in FIG. 1, the first and second piezoelectric substrates 1, 2 are preferably made of PZT-based piezoelectric ceramics with the polarization treatment being effectuated along the thickness thereof.

The first piezoelectric substrate 1 has a first filter section of the energy trap type utilizing the thickness longitudinal or "extensional" vibration mode disposed thereon. The second piezoelectric substrate 2 has a second filter section of the energy trap type utilizing the thickness longitudinal vibration mode. A coupling capacitance section is disposed on either one of the first and second piezoelectric substrates 1, 2.

Figure 2:
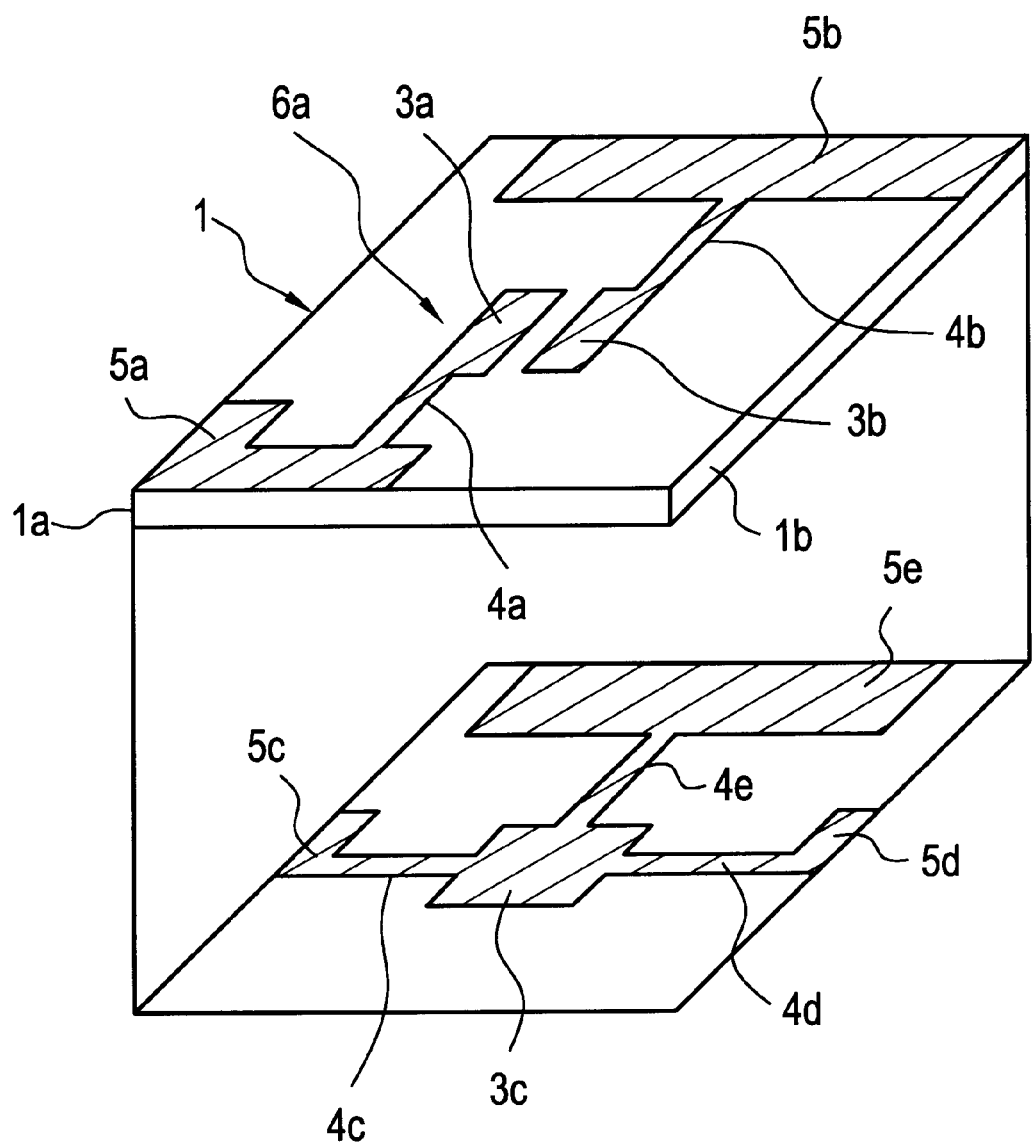
FIG. 2 is a perspective view for explanation of the shape of electrodes formed on a first piezoelectric substrate used in the preferred embodiment shown in FIG. 1.

FIG. 2 depicts a perspective view of the first piezoelectric substrate 1. In FIG. 2, electrodes which are located on the lower or bottom surface of the first piezoelectric substrate 1 are shown in a manner such that each electrode is virtually projected downwardly for purposes of facilitation of visual understanding only. The first piezoelectric substrate 1 includes an upper or top surface on which a pair of resonance electrodes 3a, 3b are disposed at a central portion thereof so that the electrodes 3a, 3b oppose each other and are separated by a desired distance. The piezoelectric substrate 1 also includes a bottom surface on which a common electrode 3c is formed so as to underly the resonance electrodes 3a, 3b in the so-called "top/bottom-surface overlap" relationship with the substrate 1 being sandwiched therebetween.

The resonance electrode 3a is connected through an interconnection conductor portion 4a to a lead electrode 5a.

The lead electrode 5a extends to one side surface of the piezoelectric substrate 1.

The resonance electrode 3b is connected via an interconnection conductor 4b to a capacitance electrode 5b which may also function as the lead electrode.

On the bottom surface of the piezoelectric substrate 1, the common electrode 3c is connected by connection conductors 4c, 4d to lead electrodes 5c, 5d, respectively. The lead electrodes 5c, 5d are formed so as to extend along opposite side surfaces 1a, 1b of the piezoelectric substrate 1, respectively. The common electrode 3c is also connected via a connection conductor 4e to a capacitance electrode 5e. The capacitance electrode 5e is arranged on the bottom substrate surface so as to oppose its overlying top-surface capacitance electrode 5b with the piezoelectric substrate 1 being disposed therebetween.

Figure 3A:
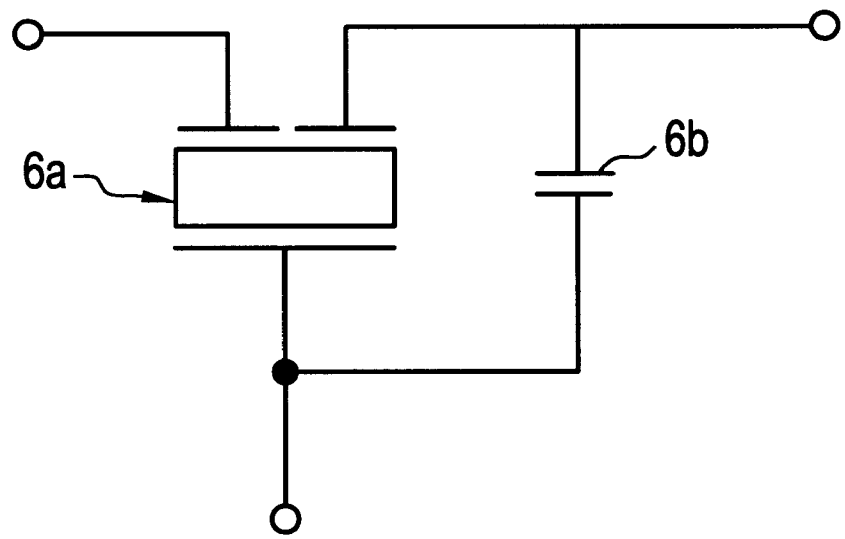
FIG. 3A is a circuit diagram illustrating a circuit provided on a first piezoelectric substrate of the preferred embodiment shown in FIG. 1.

A circuit configuration of the piezoelectric substrate 1 is shown in FIG. 3A. As apparent from FIG. 3A, the piezoelectric substrate 1 includes a first filter section 6a having the resonance electrodes 3a, 3b and associated common electrode 3c, and a coupling capacitance section 6b comprised of the capacitance electrodes 5b, 5e.

Figure 3B:
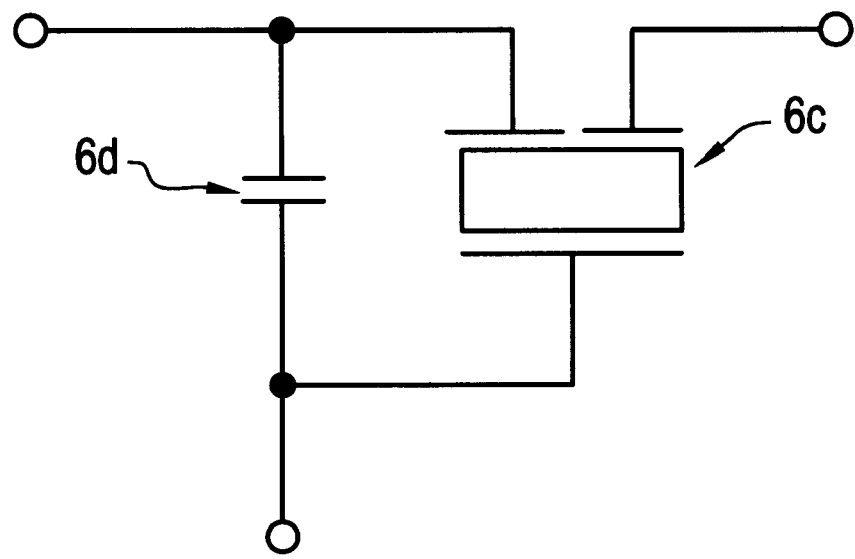
FIG. 3B is a circuit diagram illustrating a circuit provided on a second piezoelectric substrate of the preferred embodiment shown in FIG. 1.

As seen in FIG. 1, the remaining piezoelectric substrate 2 is preferably similar in structure to the piezoelectric substrate 1 except that it is upside down with respect to the upper and lower electrode patterns thereof as compared to the first piezoelectric substrate 1. Accordingly, in the piezoelectric substrate 2, a second filter 6c and associated coupling capacitance section 6d are arranged as shown in FIG. 3B. Explanation of the electrodes of the first piezoelectric substrate 1 and corresponding ones of the second piezoelectric substrate 2 will not be made herein to avoid repetition in view of the description of the same above.

Referring to FIG. 1, the chip type piezoelectric filter of this preferred embodiment is such that the first and second piezoelectric substrates 1, 2 are laminated to each other in the direction of thickness with adhesive 8 applied therebetween for secure adhesion thereof. More specifically, the first and second piezoelectric substrates 1, 2 are laminated and tightly bonded by adhesive 8 so as to define one integral multilayer structure in which the common electrodes 3c, 3c of the first and second piezoelectric filter sections are located on the inner surfaces of the resulting lamination structure.

Further, an outer substrate 10 is laminated onto the top of the piezoelectric substrate 1 for adhesion therewith by adhesive 7. Similarly, another outer substrate 11 is laminated on the bottom of piezoelectric substrate 2 for adhesion by adhesive 9 thereto.

In order to form a space required for facilitating free vibration of the first and second filter sections arranged on the first and second piezoelectric substrates 1, 2, the adhesive materials 7–9 are not coated on selected substrate surface portions where the first and second filter sections are arranged. Accordingly, the adhesive layers 7–9 are depicted in FIG. 1 in a way such that the layers have openings 7a–9a in certain regions corresponding to the locations of such filter sections optionally, the openings 7a, 9a may be eliminated from adhesive layers 7–9 in cases where recess portions are preformed in the inner surfaces of the outer substrates 10, 11 and the adhesive materials 7–9 are applied to the outer substrates 10, 11.

While the adhesives 7–9 are typically coated on one of the opposite surfaces of both members to be adhered together, these may alternatively be coated on the both surfaces where appropriate. Still alternatively, sheet-like adhesive with the openings 7a–9a may be used as the adhesive materials 7–9.

The outer substrates 10, 11 may be made of a desired insulative material including, but not limited to, dielectric ceramics such as alumina or synthetic resin. The outer substrate 10 has on its top surface external electrodes 12a–12f. Each of the electrodes 12a–12f extends from part of the top substrate surface to the long-side edge surface 10a, 10b as shown in FIG. 1. The other outer substrate 11 has external electrodes 13d–13f formed at selected locations along side edge surfaces 11a, 11b. Each of the electrodes 13d–13f is aligned with that of a corresponding one of electrodes 12d–12f along the thickness of laminated substrates 1, 2 providing vertical linear strips on the side edge surface 11a, 11b. Note that external electrodes 12a–12f will not always be formed on the top surface side as long as these electrodes are formed on the long-side edge surfaces 10a, 10b of outer substrate 10.

Similarly, external electrodes 13a–13c are also formed (see FIG. 4C) at selected locations on the opposite side edge surfaces of substrate 11 so that they are aligned with the external electrodes 12a–12c of substrate 10, thereby defining spaced-apart linear strips thereon along the thickness of substrates 10, 11.

Figure 4A:
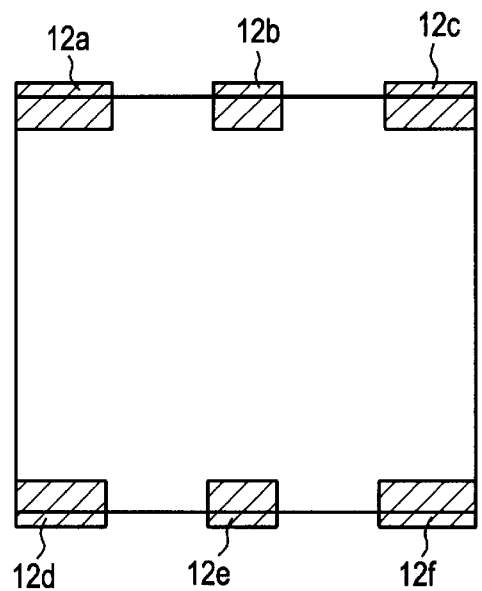
FIG. 4A is a plan view of a chip type piezoelectric filter in accordance with one preferred embodiment of the invention.
Figure 4B:
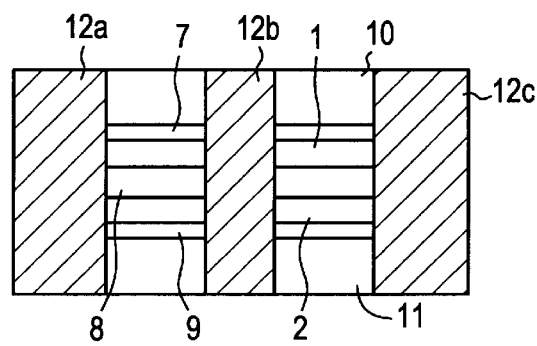
FIG. 4B is a side view of a chip type piezoelectric filter in accordance with one preferred embodiment of the invention.
Figure 4C:
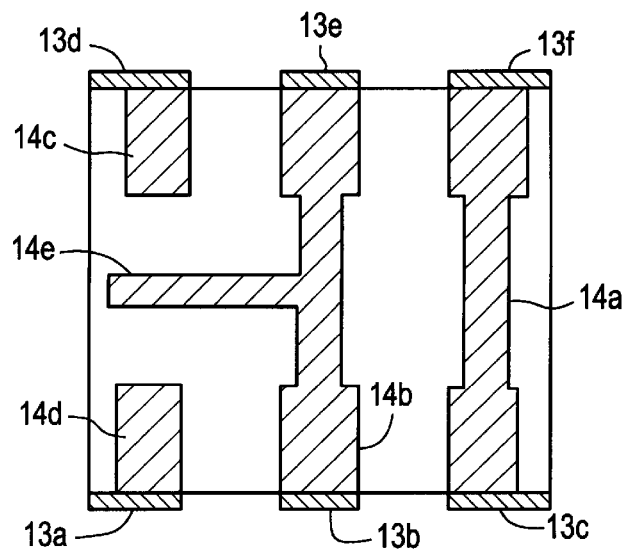
FIG. 4C is a bottom view of a chip type piezoelectric filter in accordance with one preferred embodiment of the invention.

The first and second piezoelectric substrates 1, 2 and the outer substrates 10, 11 are laminated to one another and then bonded by adhesive to produce a chip type piezoelectric filter shown in FIGS. 4A–4C. Note that an electrode pattern shown in FIG. 4C is disposed on the bottom surface of the outer substrate 11 as electrodes to be connected to the external electrodes 13a–13f. In other words, the external electrodes 13c, 13f, are connected by an electrode 14a. Also, the external electrodes 13e, 13b serving as external electrodes coupled to the ground are connected by electrode 14b. Further, the external electrodes 13a, 13d are connected to the electrodes 14c, 14d on the bottom surface. The electrode 14b has an extension section 14e that extends between the electrodes 14c, 14d. The extension section 14e is provided in order to reduce the stray capacitance existing between the input side external electrode 14c and output side external electrode 14d.

Figure 5:
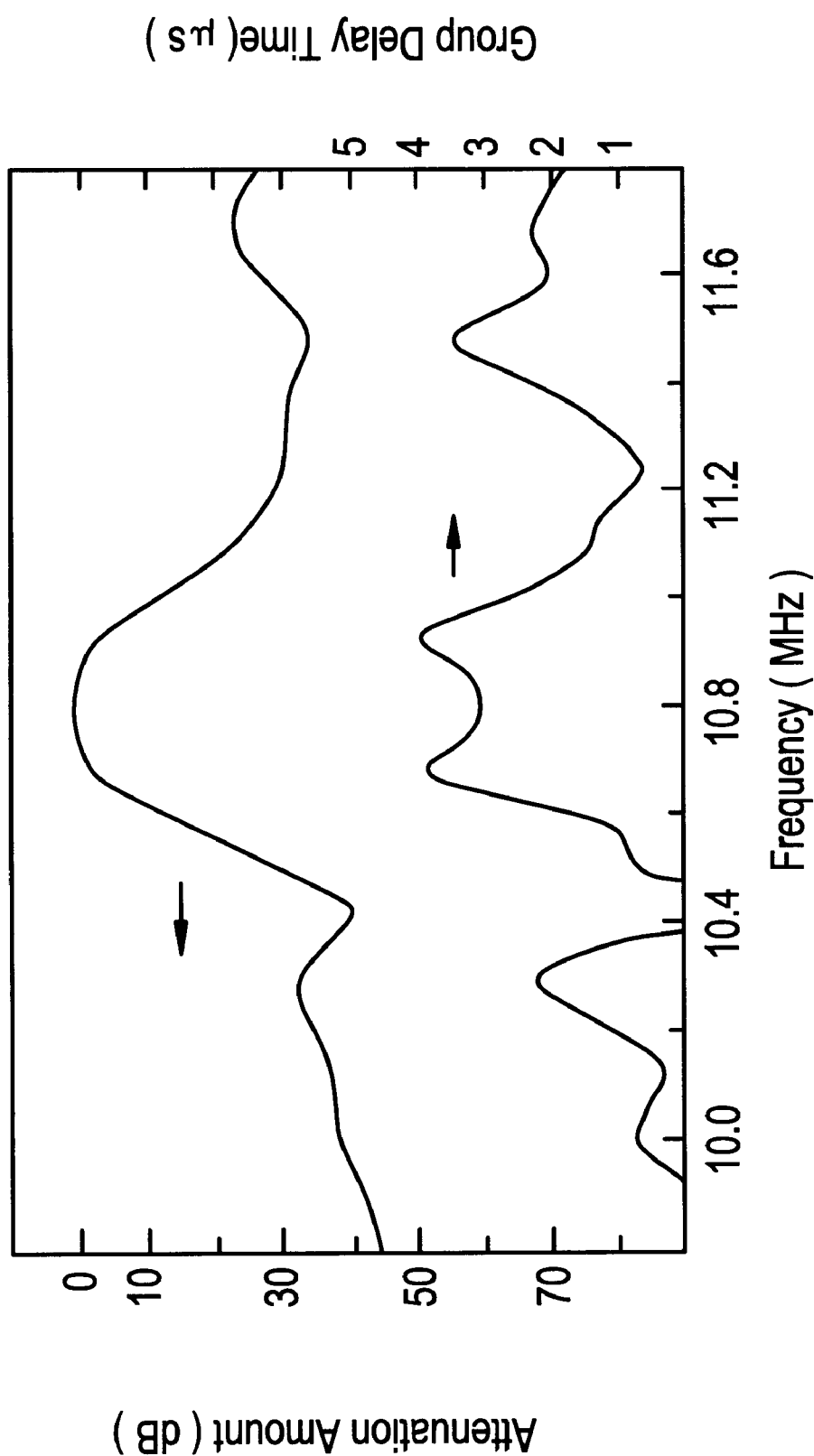
FIG. 5 is a diagram showing an attenuation amount versus frequency characteristic and group delay time characteristic of the chip type piezoelectric filter in accordance with one preferred embodiment of the invention.
Figure 20:
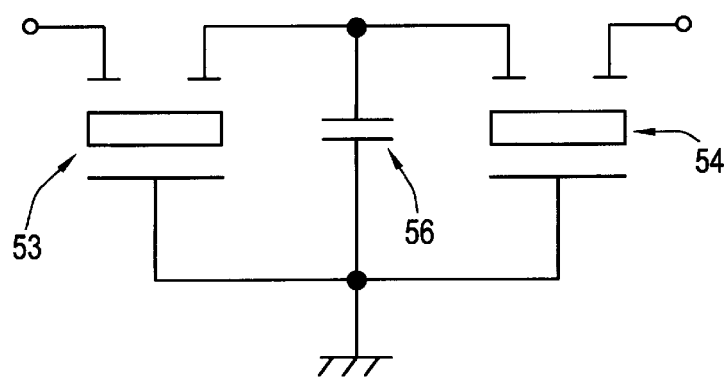
FIG. 20 is a diagram showing a circuit configuration of the prior art chip type piezoelectric filter.

The chip type piezoelectric filter 1 of this preferred embodiment arranged as described above has a configuration with the first and second piezoelectric filters being coupled together via a coupling capacitor in a way similar to that of the circuitry shown in FIG. 20. An attenuation amount versus frequency characteristic of this chip type piezoelectric filter is shown in FIG. 5 along with the group delay time characteristics thereof. It is apparent from viewing FIG. 5 that the pass band region falls within a range of from about 10.67 to about 10.93 MHz, which in turn leads to capability of providing a superior band filter with excellent band-pass characteristics.

Figure 19:
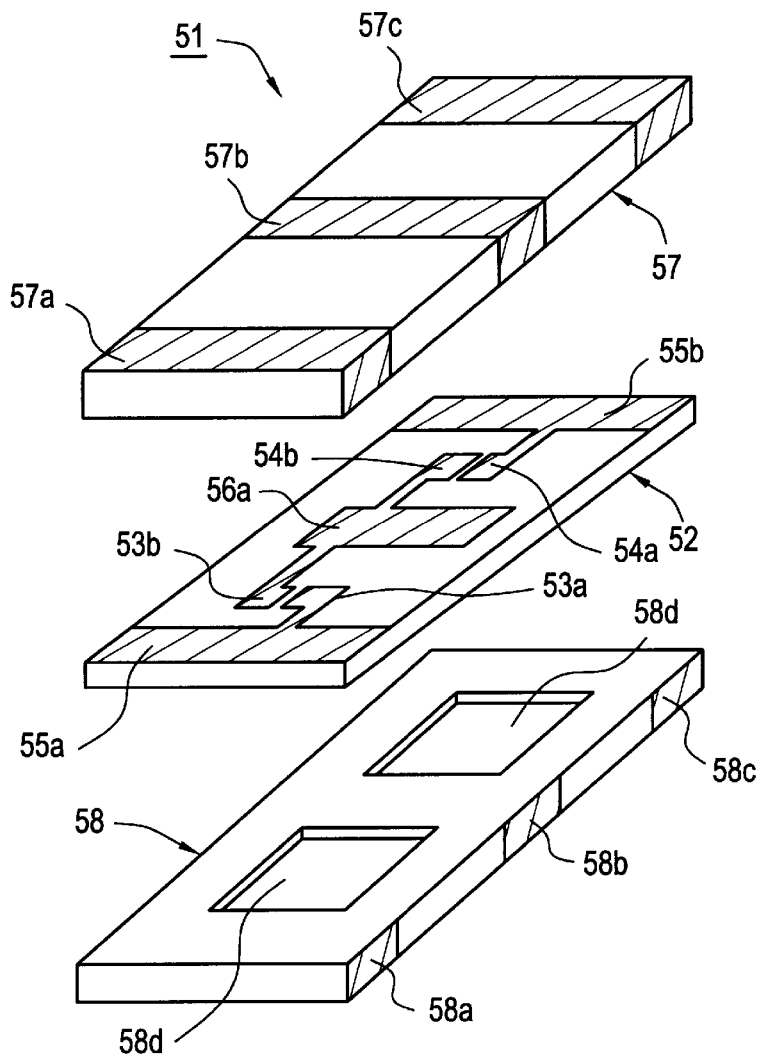
FIG. 19 is an exploded perspective diagram illustrating a conventional chip type piezoelectric filter.

With the chip type piezoelectric filter 1 of this preferred embodiment, since the first piezoelectric substrate 1 is designed so as to permit arrangement of the first filter section 6a and coupling capacitance section 6b thereon whereas the second piezoelectric substrate 2 allows the second filter section 6c and coupling capacitance section 6d to be arranged thereon, while having a multilayer lamination structure of the first and second piezoelectric substrates 1, 2, the resulting mount space is significantly decreased as compared to the prior art piezoelectric filter 51 which has plural filter sections disposed laterally on a single substrate (see FIG. 19).

In addition, since the coupling capacitance sections 6b, 6d are also arranged so that each is subdivided or "distributed" between the first and second piezoelectric substrates 1, 2, it is possible to decrease the area required for the capacitance electrodes disposed on the piezoelectric substrates, which also advantageously and effectively reduces the mount space required.

Further, any possible stray capacitance is reduced or minimized because the first and second piezoelectric substrates 1, 2 are laminated such that the common electrodes 3c, 3c of first and second piezoelectric filter sections 6a, 6c are located at the interior thereof.

Furthermore, it is possible to provide a superior chip type piezoelectric filter with excellent temperature characteristics due to the fact that the coupling capacitance sections 6b, 6d are arranged on the piezoelectric substrates 1, 2 which constitute the first and second filter sections 6a, 6c causing the filter sections 6a, 6c and coupling capacitance sections 6b, 6d to be identical to each other in temperature characteristic. More precisely, in cases where the piezoelectric substrate and the coupling capacitance section are constituted using separate substrates laminated together, it is difficult to accurately and reliably control the temperature characteristics due to a possible difference between the temperature characteristics of the filter section and those of the coupling capacitance section. In contrast, with the chip type piezoelectric filter 1 according to the preferred embodiment, the temperature characteristics thereof are stabilized successfully.

Moreover, in the prior art, when a capacitor for defining the coupling capacitance section was formed on the outer substrate, it was required that the outer substrates 10, 11 be made of specific materials with increased dielectricity thereby increasing production costs. The chip type piezoelectric filter of the preferred embodiment, by contrast, avoids the need to use such capacitors on the outer substrates 10, 11 thus permitting the outer substrates 10, 11 to be comprised of dielectric materials which are inherently low in dielectricity and yet high in processability or machinability.

Figure 6:
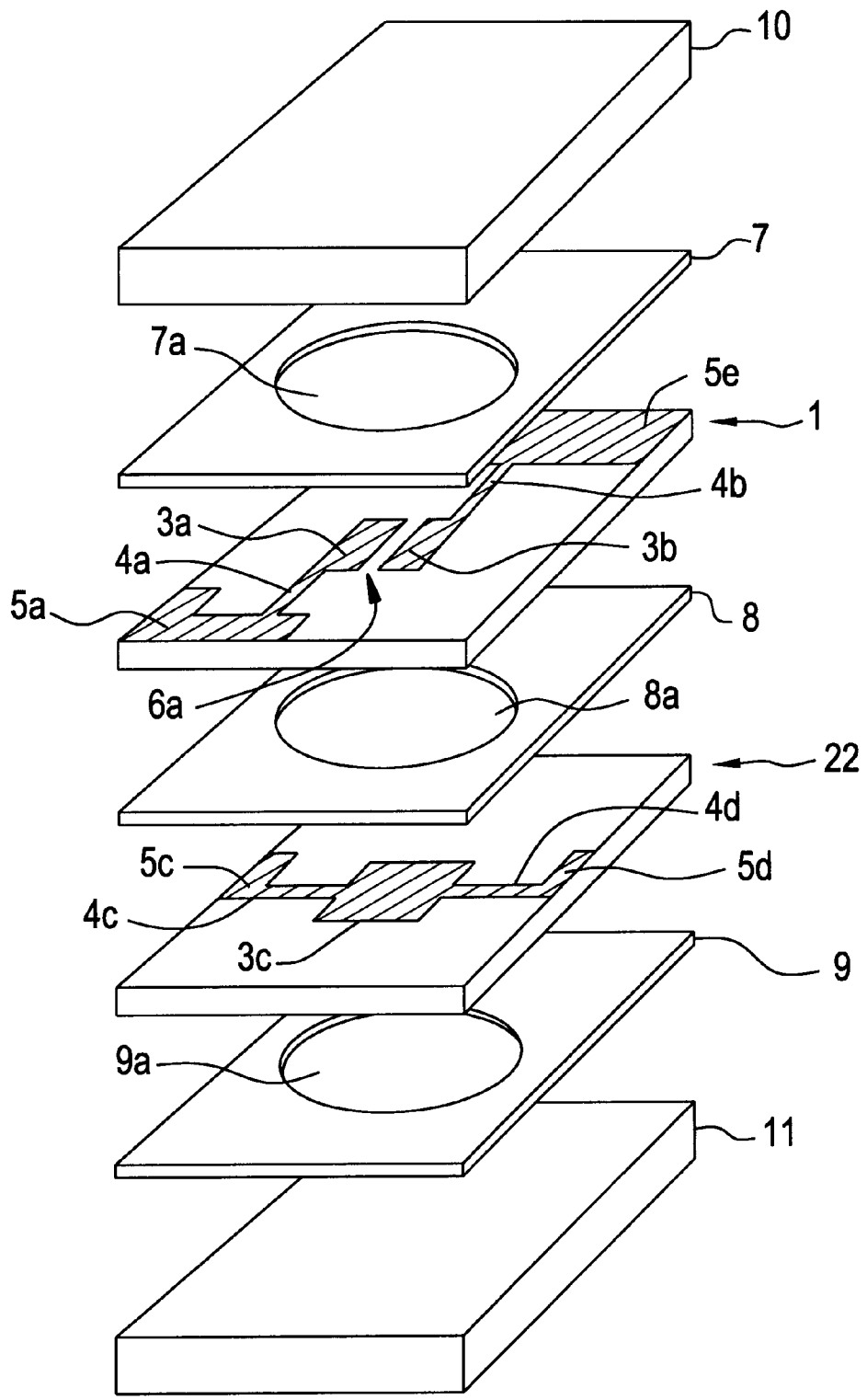
FIG. 6 is an exploded perspective view illustrating a chip type piezoelectric filter in accordance with a second preferred embodiment of the present invention.

FIG. 6 illustrates an exploded perspective view for explanation of a chip type piezoelectric filter in accordance with another preferred embodiment of the present invention. While in the chip type piezoelectric filter 1 described above, the filter section and coupling capacitance section are arranged on each one of the first and second piezoelectric substrates 1, 2, a preferred embodiment the present invention may alternatively be designed so that the filter section alone is arranged on at least one piezoelectric substrate.

More specifically, as shown in FIG. 6, the chip type piezoelectric filter in accordance with the second preferred embodiment is configured so that its second piezoelectric substrate 22 does not include any coupling capacitance section thereby allowing only the second filter section to be arranged thereon. The remaining parts or components thereof are substantially the same as those of the first preferred embodiment described above. Accordingly, like reference numerals are used to designate like components with any detailed explanations thereof eliminated herein to avoid repetition.

Figure 7:
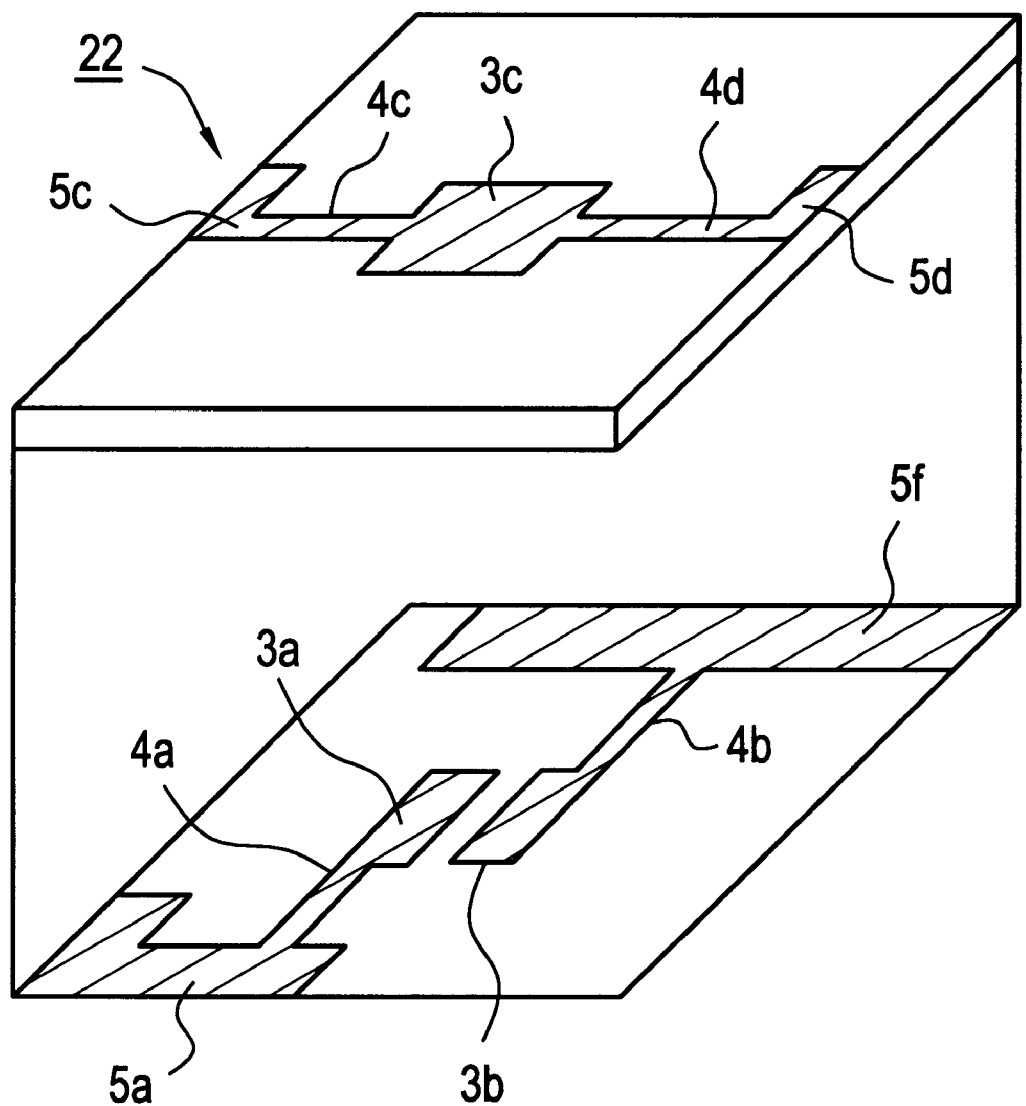
FIG. 7 is a perspective view illustrating of an electrode structure formed on a second piezoelectric substrate used in the second preferred embodiment.

As shown in FIG. 7, a common electrode 3c, connection conductor sections 4c, 4d and lead electrodes 5c, 5d are provided on the top surface of the second piezoelectric substrate 22. However, no parts corresponding to the connection conductor section 4e and lead electrode 5e of the first preferred embodiment are formed thereon. The resonance electrodes 3a, 3b and connection conductors 4a, 4b as well as lead electrodes 5a, 5f are provided on the bottom surface of the second piezoelectric substrate 22 while the capacitor electrode 5b of FIG. 2 is eliminated.

With such a structure, it becomes possible to attain the circuit configuration having the first and second filter sections 6a, 6c connected via the coupling capacitance section 6b, by connecting the lead electrode 5f via the capacitor electrode 5e and the external electrodes 12f, 13f, which electrode 5e is provided on the top surface of the first piezoelectric substrate 1 and functions as the lead electrode.

While the first and second preferred embodiments are arranged such that the first and second filter sections 6a, 6c are connected through the associated coupling capacitance section, more than one piezoelectric filter section may be further connected via a coupling capacitor in chip type piezoelectric filters in accordance with the principles of the invention.

Figure 8:
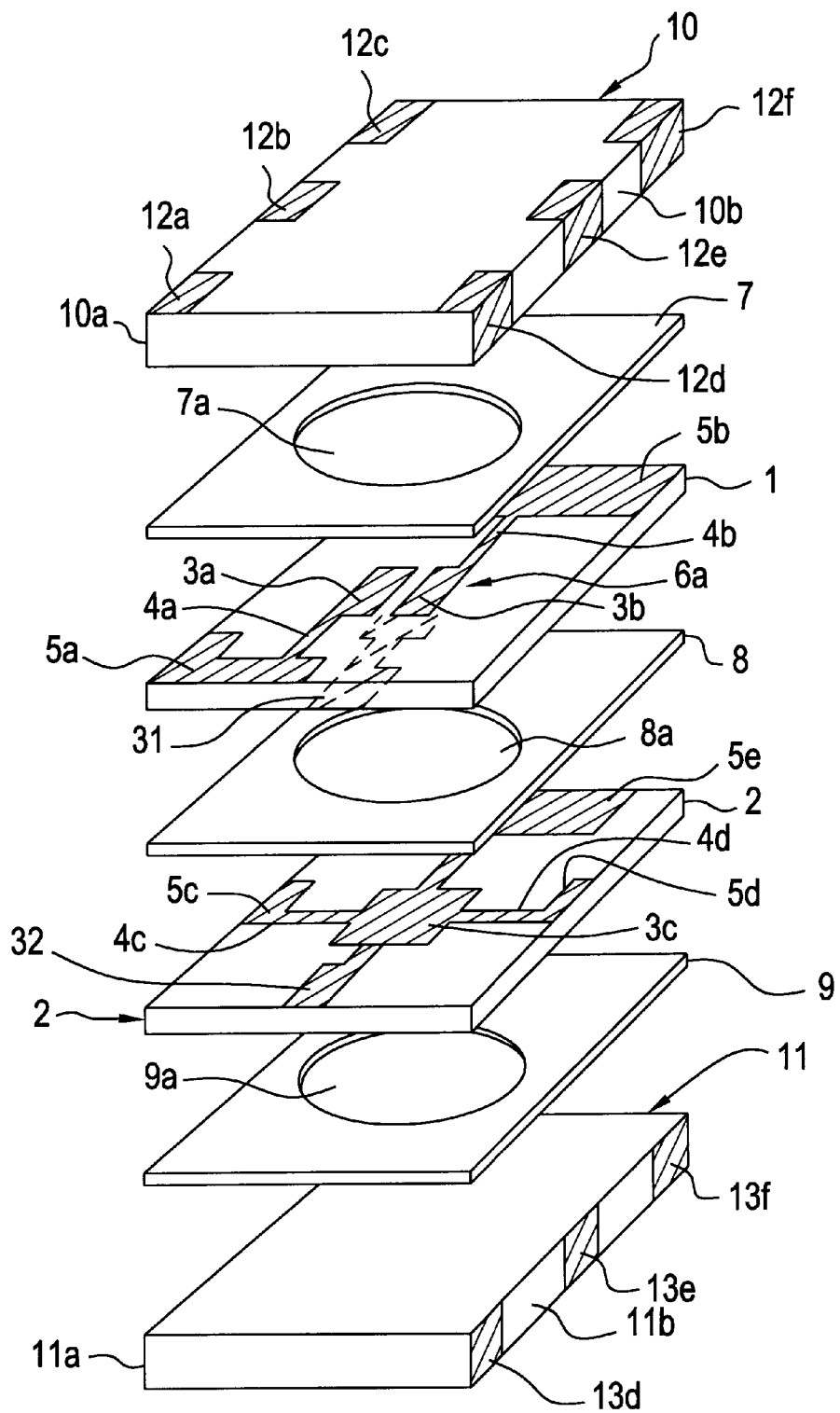
FIG. 8 is an exploded perspective diagram illustrating a chip type piezoelectric filter in accordance with a third preferred embodiment of the present invention.

FIG. 8 shows an exploded perspective view of a chip type piezoelectric filter in accordance with a third preferred embodiment of the invention. This preferred embodiment is similar in structure to the chip type piezoelectric filter of the first preferred embodiment with a shield electrode being additionally provided in a manner described later. Accordingly, in FIG. 8, like elements are designated by like reference numerals with the explanation given above being incorporated herein by reference for purposes of elimination of repetitive explanation.

In the chip type piezoelectric filter of this preferred embodiment, a shield electrode 31 is disposed on the bottom surface of the first piezoelectric substrate 1 whereas another shield electrode 32 is disposed on the top surface of second piezoelectric substrate 2.

Figure 9:
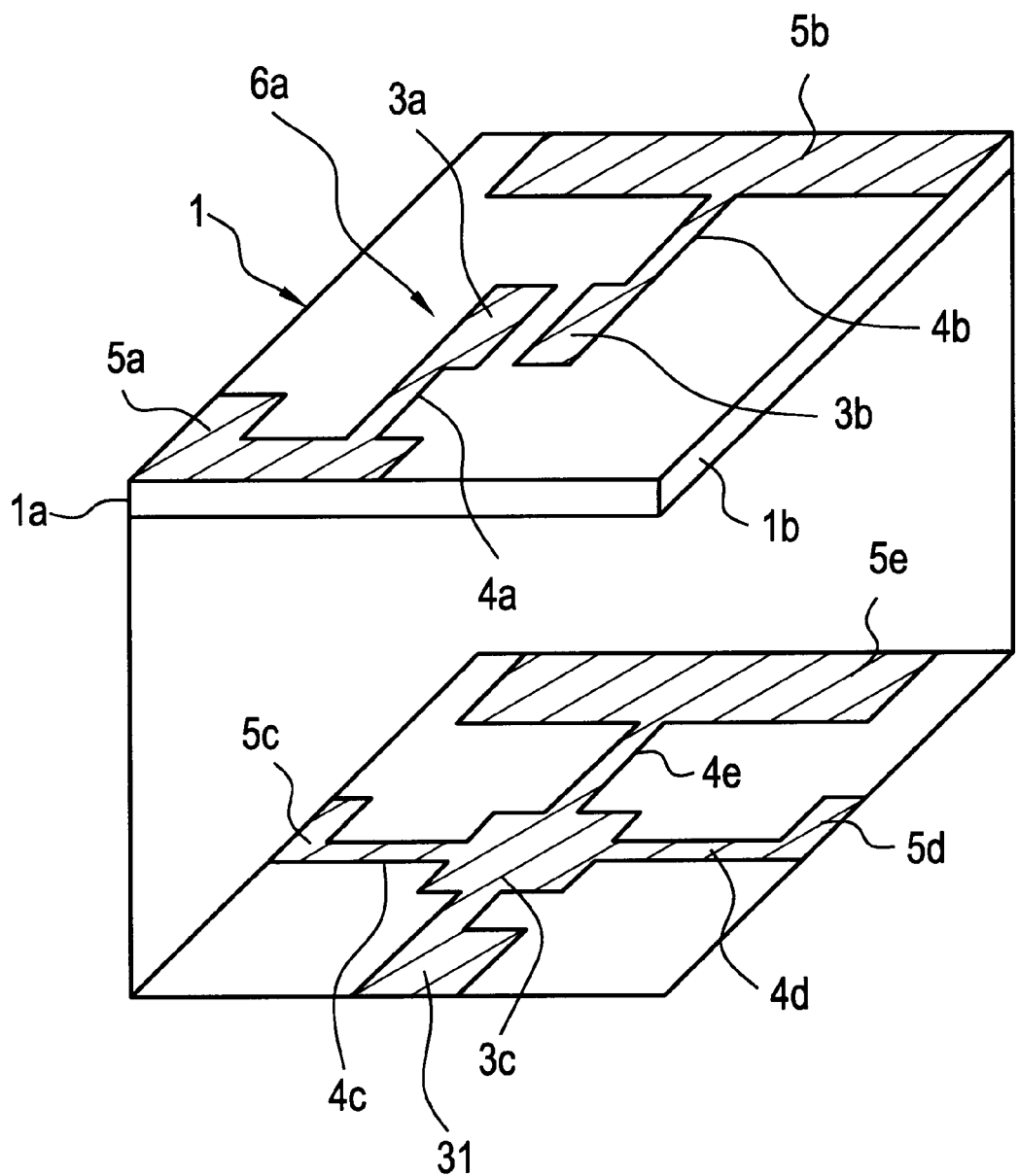
FIG. 9 is a perspective diagram illustrating an electrode structure formed on a second piezoelectric substrate used in the third preferred embodiment.

A pattern shape of the electrode on the bottom surface of the first piezoelectric substrate 1 will now be explained with reference to FIG. 9. Specifically, as apparent from FIG. 9, the shield electrode 31 is formed in such a way as to be electrically connected to the common electrode 3c and to extend along a selected edge opposite to the edge where the capacitor electrode 5e is located.

With respect to the second piezoelectric substrate 2, the shield electrode 32 is formed so that it extends along a specific edge opposite to the edge where the capacitor electrode 5e is located and is electrically connected to the common electrode 3c.

In the chip type piezoelectric filter of this preferred embodiment, while the first and second filter sections 6a, 6c are connected through an associated coupling capacitance section in the manner described above, the shield electrodes 31, 32 are further connected respectively to the common electrodes 3c, 3c which are coupled to the ground at respective filter sections. This makes it possible to further effectively reduce the stray capacitance between the lead electrodes 5a, 5a.

In particular, with this preferred embodiment, the first shield electrode 31 and second shield electrode 32 are specifically arranged so that these do not overlap each other along the thickness thereof thereby enabling the stray capacitance to decrease between the first and second filter sections 6a, 6c, which in turn allows achievement of excellent filter characteristics.

In this way, any possible stray capacitance between the first and second lead electrodes 5a, 5a is reduced providing excellent resonance characteristics by respectively forming the first and second shield electrodes 31, 32 at the filter sections 6a, 6c and further arranging the first and second shield electrodes 31, 32 so that they are prevented from at least partly overlapping each other along the thickness of the structure, as will be described in detail in conjunction with FIG. 10 to FIG. 18 below.

FIG. 10A through FIG. 17B are schematic pictorial representations of lead electrodes 5a, 5a showing sectional views of respective piezoelectric filters each having the first and second piezoelectric substrates 1, 2 laminated to each other and bonded by adhesive thereby forming a multilayer lamination structure, on which substrates the first and second piezoelectric filters 6a, 6c are disposed, respectively.

Figure 10A:
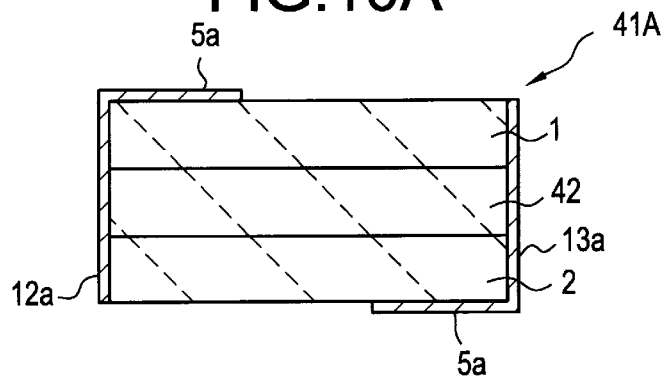
FIG. 10A is a schematic cross-sectional diagram of a chip type piezoelectric filter prepared as an experimental example.

An exemplary chip type piezoelectric filter 41A is shown in FIG. 10A by way of example. The first and second piezoelectric substrates 1, 2 are laminated to each other with an adhesive layer 42 sandwiched therebetween. Note that in the piezoelectric filter 41A, resonance electrodes or equivalents thereto provided on both major surfaces of the first and second piezoelectric substrates 1, 2 are eliminated from illustration herein. In FIG. 10A to FIG. 17B, only limited parts including the lead electrodes 5a, 5a and external electrodes 12a, 13a coupled to the lead electrodes 5a, 5a are schematically depicted for purposes of explanation of the effect of formation of the first and second shield electrodes described above, as well as any influence caused by overlap of the shield electrodes 31, 32.

More specifically, in the piezoelectric filter 41A shown in FIG. 10A, the first and second piezoelectric substrates 1, 2 are laminated to each other with the adhesive layer 42 disposed therebetween while those surfaces on which their common electrodes 3c (see FIG. 1) are formed are oriented inwardly in a way similar to that of the preferred embodiment shown in FIG. 1. Additionally, in the piezoelectric filter 41A, the shield electrodes 31, 32 are not provided therein.

Figure 10B:
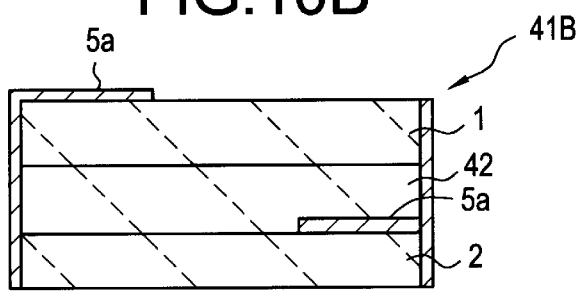
FIG. 10B is a schematic cross-sectional diagram of a chip type piezoelectric filter prepared as an experimental example.

In a piezoelectric filter 41B shown in FIG. 10B, unlike the piezoelectric filter 41A, the piezoelectric substrate 2 is laminated in a manner such that the lead electrode 5a is positioned on the top surface i.e., inside of the second piezoelectric substrate 2.

In respective piezoelectric filters 43A to 49A shown in FIG. 11A, FIG. 12A, FIG. 13A, FIG. 14A, FIG. 15A, FIG. 16A and FIG. 17A, any one of such filters is structurally similar to the piezoelectric filter 41A in that the first and second piezoelectric substrates 1, 2 are disposed opposite to each other while causing the common electrode 3c coupled to the ground to directly face each other. On the other hand, in respective piezoelectric filters 43B to 49B shown in FIG. 11B, FIG. 12B, FIG. 13B, FIG. 14B, FIG. 15B, FIG. 16B and FIG. 17B, the second piezoelectric substrate 2 is laminated so that the lead electrode 5a is positioned on the top surface of second piezoelectric substrate 2 in a manner similar to that of the piezoelectric filter 41B. Consequently, with the piezoelectric filters 43B–49B, the common electrodes 3c coupled to the ground do not oppose each other with the adhesive layer 42 applied therebetween, which results in provision of a specific structure with large stray capacitance as compared to the piezoelectric filters 41A, 43A–49A.

Figure 11A:
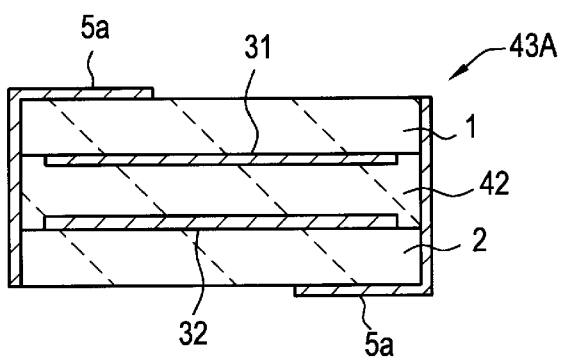
FIG. 11A is a schematic sectional diagram illustrating a chip type piezoelectric filter prepared as an experimental example.

The piezoelectric filter 43A shown in FIG. 11A is designed so that the first shield electrode 31 and the second shield electrode 32 overlap each other in the direction along the thickness thereof. Also, the first and second shield electrodes 31, 32 have a relatively increased overlap width (the overlap distance in the lateral direction of FIG. 11).

Figure 11B:
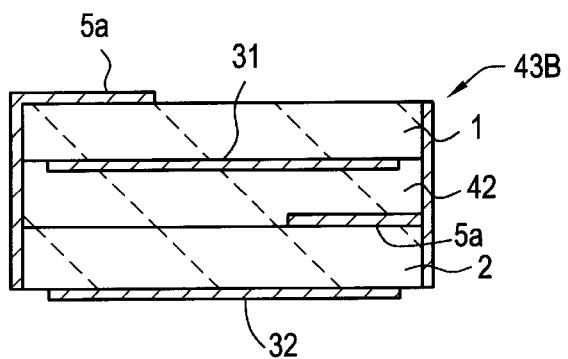
FIG. 11B is a schematic sectional diagram illustrating a chip type piezoelectric filter prepared as an experimental example.

In the piezoelectric filter 43B shown in FIG. 11B, the overlap width of the first and second shield electrodes 31, 32 is preferably equal to that of the piezoelectric filter 43A.

Figure 12A:
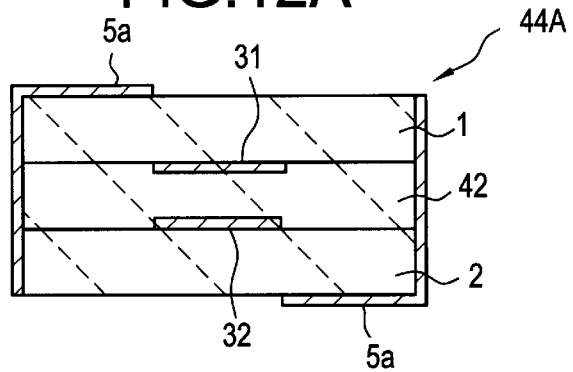
FIG. 12A is a schematic sectional diagram illustrating a chip type piezoelectric filter prepared as an experimental example.
Figure 12B:
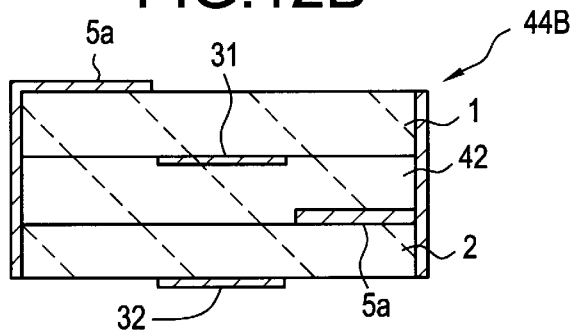
FIG. 12B is a schematic sectional diagram illustrating a chip type piezoelectric filter prepared as an experimental example.
Figure 13A:
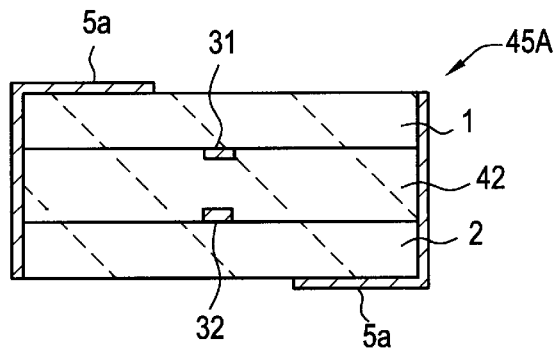
FIG. 13A is a schematic sectional diagram illustrating a chip type piezoelectric filter prepared as an experimental example.
Figure 13B:
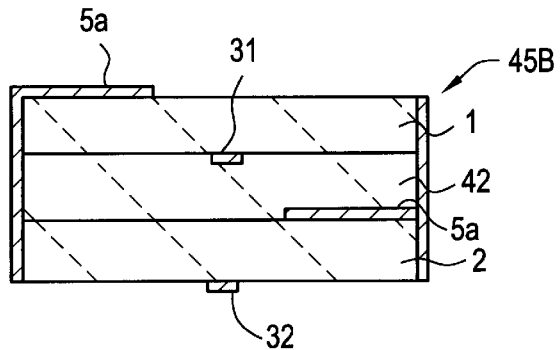
FIG. 13B is a schematic sectional diagram illustrating a chip type piezoelectric filter prepared as an experimental example.
Figure 14A:
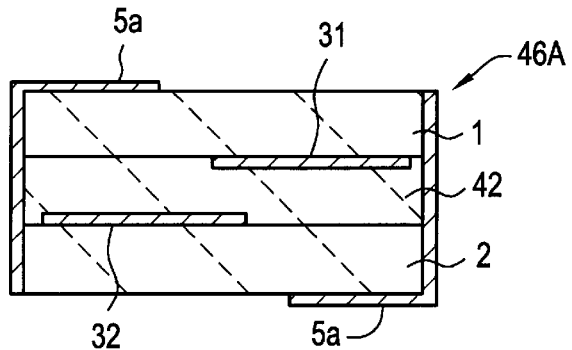
FIG. 14A is a schematic sectional diagram illustrating a chip type piezoelectric filter prepared as an experimental example.
Figure 14B:
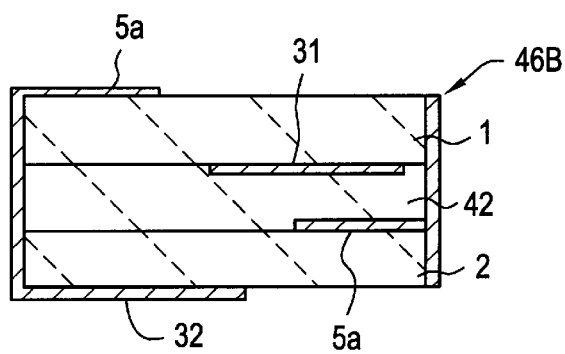
FIG. 14B is a schematic sectional diagram illustrating a chip type piezoelectric filter prepared as an experimental example.
Figure 15A:
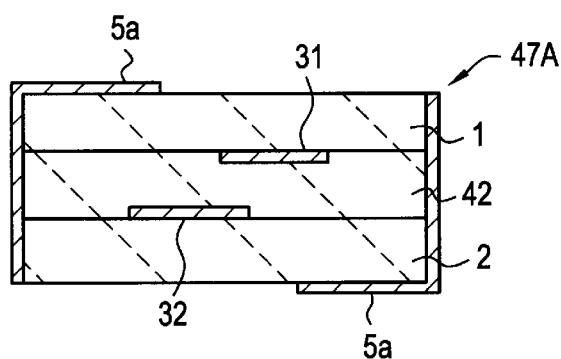
FIG. 15A is a schematic sectional diagram illustrating a chip type piezoelectric filter prepared as an experimental example.
Figure 15B:
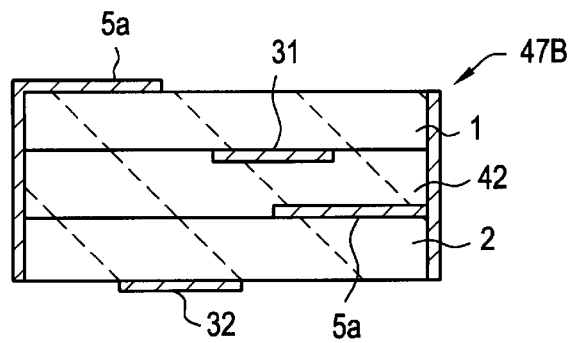
FIG. 15B is a schematic sectional diagram illustrating a chip type piezoelectric filter prepared as an experimental example.
Figure 16A:
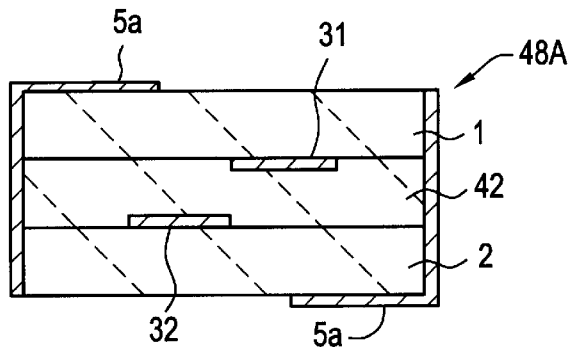
FIG. 16A is a schematic sectional diagram illustrating a chip type piezoelectric filter prepared as an experimental example.
Figure 16B:
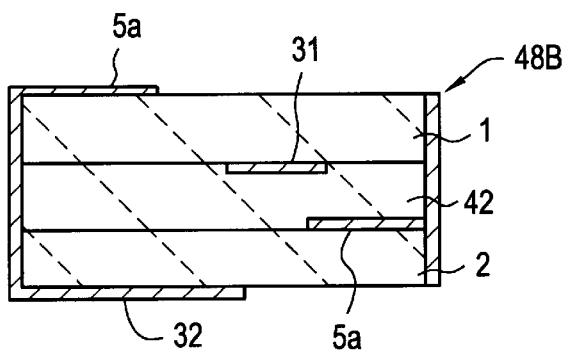
FIG. 16B is a schematic sectional diagram illustrating a chip type piezoelectric filter prepared as an experimental example.
Figure 17A:
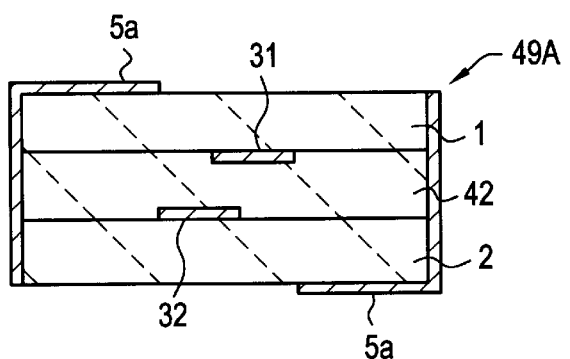
FIG. 17A is a schematic sectional diagram illustrating a chip type piezoelectric filter prepared as an experimental example.
Figure 17B:
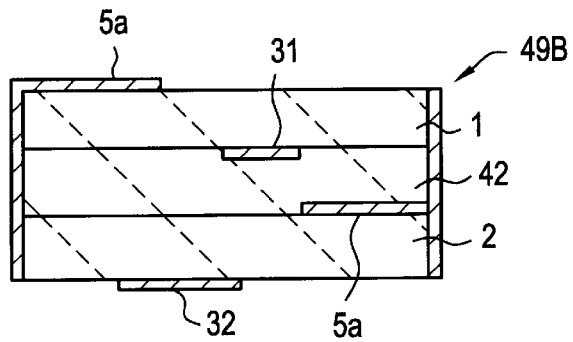
FIG. 17B is a schematic sectional diagram illustrating a chip type piezoelectric filter prepared as an experimental example.

In a piezoelectric filter 44A shown in FIG. 12A and a piezoelectric filter 44B shown in FIG. 13A, either one is similar in structure to the piezoelectric filter 43A shown in FIG. 11A with the overlap width of the first and second shield electrodes 31, 32 being rendered smaller sequentially. Also, the piezoelectric filters 44B, 45B are similar in structure to the piezoelectric filter 44B with the first and second shield electrodes 31, 32 being sequentially decreased in overlap width thereof.

In the piezoelectric filters 46A–49A shown in FIG. 14A, FIG. 15A, FIG. 16A and FIG. 17A, the first and second shield electrodes 31, 32 are specifically disposed such that these electrodes do not completely overlap each other. In other words, these filters have the arrangement in which the first and second shield electrodes only partially overlap each other.

In the piezoelectric filters 46B–49B shown in FIG. 14B, FIG. 15B, FIG. 16B and FIG. 17B, the shield electrodes do not completely overlap each other along the thickness thereof in a manner similar to that of the piezoelectric filters 46A–49A. Note however that in the piezoelectric filters 46B–49B, the second piezoelectric substrate 2 is upside down, with the top of it appearing at the bottom thereof, with respect to the orientation of substrate 2 when compared to piezoelectric filters 46A–49A.

Now, as examples of the foregoing piezoelectric filters 41A, 41B, 43A, 43B–49A and 49B, several chip type piezoelectric filters were prepared which include piezoelectric substrates 1, 2 made of lead zirconate titanate (PZT) piezoelectric ceramics and having dimensions of about 3.10×3.45×0.204 mm and being arranged to set the center frequency at about 10.8 MHz. In this case, the overlap width of the shield electrodes 31, 32 is designed to vary in the manner described above while preparing ones that are different from one another in capacitance $C_1$ defined between the lead electrode 5a formed on the top surface of the first piezoelectric substrate 1 and a reference potential and also in capacitance $C_2$ (i.e. electrostatic capacitance between the input and output) defined between the lead electrode 5a formed on the first piezoelectric substrate 1 and the lead electrode 5a provided on the second piezoelectric substrate 2.

TABLE 1

(A) Piezoelectric Resonator
(B) Along-the-Width Dimensions of Shield Electrodes (mm)
(C) Width of one Shield Electrode
(D) Whole Width of Shield Electrodes 31, 32
(E) Overlap Width of Shield Electrodes 31, 32 (mm)
(F) Capacitance $C_1$ between Input/Output and ground (pF/mm)
(G) Stray Capacitance $C_2$ between Input and Output (pF/mm)

| (A) | (B) | | | (F) | (G) |
|-----|-----|-----|-----|-----|-----|
|     | (C) | (D) | (E) |     |     |
| 41A | 0   | 0   | 0   | 0   | 1.75 |
| 43A | 2.8 | 2.8 | 2.8 | $6.02 \times 10^1$ | $4.25 \times 10^{-6}$ |
| 44A | 1.0 | 1.0 | 1.0 | $1.13 \times 10^1$ | $9.41 \times 10^{-4}$ |
| 45A | 0.2 | 0.2 | 0.2 | 4.31 | $9.66 \times 10^{-2}$ |
| 46A | 1.5 | 2.8 | 0.2 | $1.34 \times 10^1$ | $4.33 \times 10^{-5}$ |
| 47A | 0.8 | 1.4 | 0.2 | 5.55 | $7.60 \times 10^{-4}$ |
| 48A | 0.8 | 1.6 | 0   | 5.07 | $1.56 \times 10^{-3}$ |
| 49A | 0.6 | 1.0 | 0.2 | 4.88 | $5.75 \times 10^{-3}$ |
| 41B | 0   | 0   | 0   | 0   | 1.75 |
| 43B | 2.8 | 2.8 | 2.8 | $6.04 \times 10^1$ | $4.24 \times 10^{-6}$ |
| 44B | 1.0 | 1.0 | 1.0 | $1.13 \times 10^1$ | $9.41 \times 10^{-4}$ |
| 45B | 0.2 | 0.2 | 0.2 | 4.32 | $9.82 \times 10^{-2}$ |
| 46B | 1.5 | 2.8 | 0.2 | $1.34 \times 10^1$ | $3.80 \times 10^{-4}$ |
| 47B | 0.8 | 1.4 | 0.2 | 5.58 | $1.10 \times 10^{-3}$ |
| 48B | 0.8 | 1.6 | 0   | 5.07 | $2.49 \times 10^{-3}$ |
| 49B | 0.6 | 1.0 | 0.2 | 4.90 | $6.09 \times 10^{-3}$ |

It must be noted that use of "pF/mm" as the unit of electrostatic capacitance in Table 1 means that the values listed herein are the values originated from normalization of the electrostatic capacitance by a distance in the direction along the depth, that is, the direction normal to the opposite paper surfaces in FIG. 10 to FIG. 17.

Figure 18:
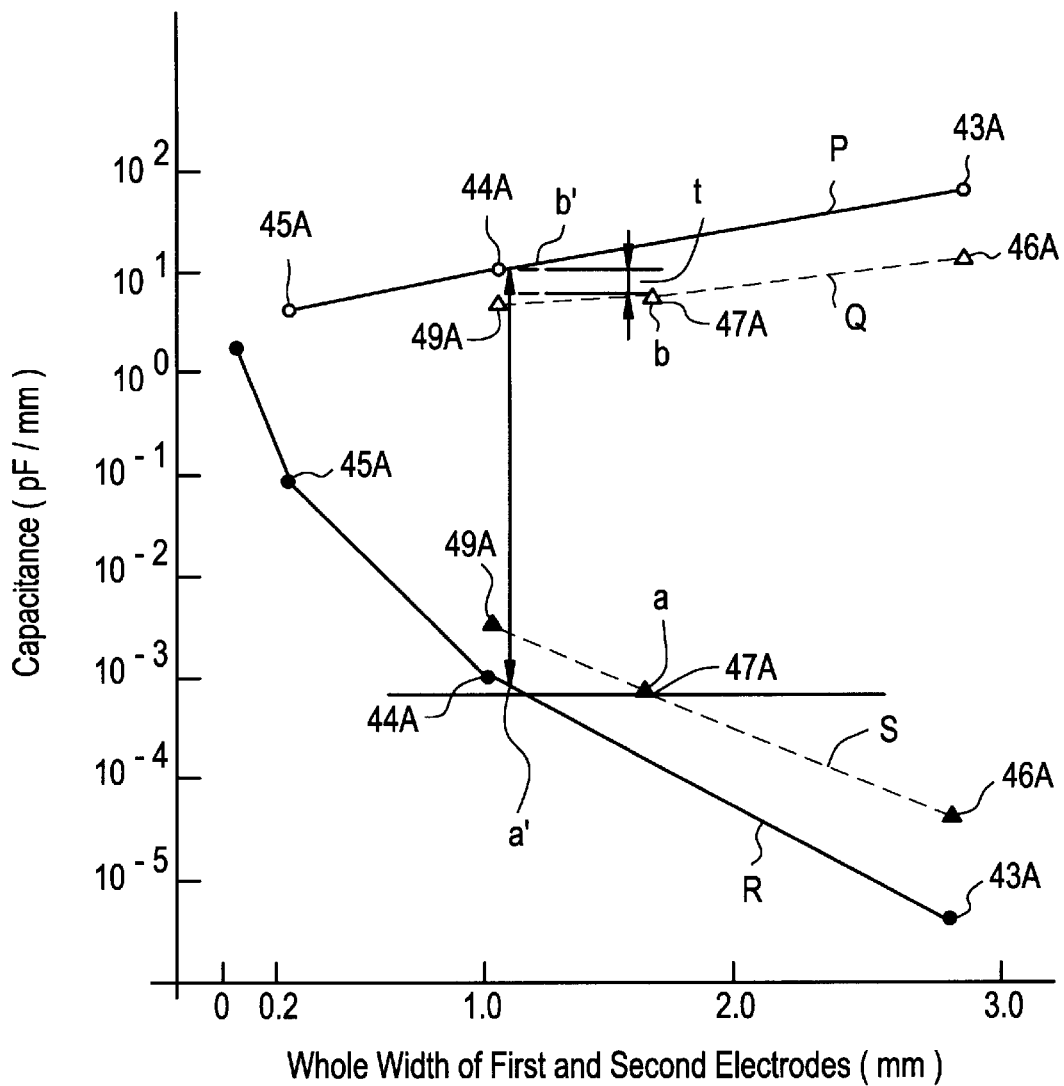
FIG. 18 is a diagram showing the relation of an overlap width of first and second shield electrodes versus the stray capacitance thereof.

With regard to the piezoelectric filters 41A, 41B, 43A, 43A–49A and 49B, the relation of the electrostatic capacitance values $C_1$, $C_2$ to the along-the-width dimensions of first and second shield electrodes is shown in FIG. 18. A solid line P and dotted line Q in FIG. 18 each represent $C_1$, that is, the electrostatic capacitance between the lead electrode connected to the first piezoelectric filter section 6a and the ground. This is also referred to as the electrostatic capacitance between the input-side or output-side lead electrode 5a and the shield electrode. The solid line R and dotted line S indicate the electrostatic capacitance $C_2$, that is, the stray capacitance between the lead electrodes 5a, 5a of the first and second piezoelectric filter sections.

Note here that reference characters used in FIG. 18 correspond to those reference characters of the piezoelectric filters described previously.

Note also that the dotted lines Q, S indicate the results relating to the chip type piezoelectric filters 46A, 47A and 49A as arranged in conformity with an arrangement wherein the first and second piezoelectric substrates are laminated so that the common electrodes of the first and second piezoelectric filter sections are opposed to each other.

In the chip type piezoelectric filter 47A having shield electrodes partly opposing each other by way of example, the resultant value of input-to-output stray capacitance is defined by a point a. In cases where an attempt is made to achieve this stray capacitance by use of a certain structure with the shield electrodes entirely opposing each other, the resulting stray capacitance might be defined by a point a' on the line R in FIG. 18. At this time, the stray capacitance between the input electrode and the ground (GND) potential or between the output electrode and GND are at points b, b' under the conditions of such points a, a',. Comparing these two values (b, b') reveals the fact that the point b has a lower value. Accordingly, for achieving substantially the same degree of reduction effect of input-to-output stray capacitance between the partial opposing structure and entire opposing structure, the former structure may cause less increase of stray capacitance between the input and GND or the output and GND as compared to the latter.

As a consequence, the chip type piezoelectric filters 46A–49 A are capable of reducing the input-to-output stray capacitance without increasing the stray capacitance between the input or output and the ground, thereby providing excellent resonance characteristics. This results because the shield electrodes 31, 32 are specifically disposed so that they do not partly oppose each other.

While the invention has been particularly shown and described with reference to preferred embodiments thereof, it will be understood by those skilled man in the art that the forgoing and other changes in form and details may be made therein without departing from the spirit of the invention.

What is claimed is:

1. A chip type piezoelectric filter, comprising:

a first piezoelectric substrate;

a second piezoelectric substrate connected to said first piezoelectric substrate;

a first piezoelectric filter section disposed on the first piezoelectric substrate;

a second piezoelectric filter section disposed on the second piezoelectric substrate; and at least one coupling capacitor being arranged to electrically connect the first piezoelectric filter section to the second piezoelectric filter section, said at least one coupling capacitor being disposed on at least one of said first and second piezoelectric substrates;

wherein each of said first and second piezoelectric filter sections comprise a pair of resonance electrodes provided on one of top and bottom major surfaces of the respective piezoelectric substrate, and a common electrode provided on the other of the top and bottom major surfaces of the respective piezoelectric substrate such that the pair of resonance electrodes and the common electrode oppose each other, and wherein the common electrodes of said first and second piezoelectric filter sections are located at an interior of an integral laminated body defined by the connected first and second piezoelectric substrates in such a way that the surface of the first piezoelectric substrate on which the common electrode is provided and the surface of the second piezoelectric substrate on which the common electrode is provided are opposed to each other.

2. The chip type piezoelectric filter according to claim 1, wherein said at least one coupling capacitor comprises a pair of capacitance electrodes each provided on a respective one of top and bottom major surfaces of said at least one of the first and second piezoelectric substrates, said pair of capacitance electrodes being disposed opposite to each other with said at least one of the piezoelectric substrates disposed therebetween.

3. The chip type piezoelectric filter according to claim 1, wherein an input/output external electrode and an external electrode connected to the ground are provided on an outer surface of a lamination body defined by laminating said first and second piezoelectric substrates in a thickness direction thereof.

4. The chip type piezoelectric filter, according to claim 1, wherein at least one of the first and second piezoelectric substrates includes a plurality of electrodes disposed on a bottom surface thereof and a plurality of external electrodes provided on external side surfaces thereof connected to selected ones of the plurality of electrodes on the bottom surface thereof, one of the plurality of electrodes on the bottom surface having an extended portion which extends to an area located between two other electrodes of the plurality of electrodes on the bottom surface.

5. The chip type piezoelectric filter according to claim 1, further comprising a pair of outer substrates each being connected to a respective one of said first and second piezoelectric substrates.

6. The chip type piezoelectric filter according to claim 1, wherein said first and second piezoelectric substrates are adapted to vibrate in a thickness longitudinal vibration mode.

7. The chip type piezoelectric filter according to claim 1, wherein said first piezoelectric substrate and said second piezoelectric substrate have temperature characteristics which are substantially the same.

8. A chip type piezoelectric filter, comprising:

a first piezoelectric substrate;

a second piezoelectric substrate connected to said first piezoelectric substrate;

a first piezoelectric filter section disposed on the first piezoelectric substrate;

a second piezoelectric filter section disposed on the second piezoelectric substrate; and at least one coupling capacitor being arranged to electrically connect the first piezoelectric filter section to the second piezoelectric filter section, said at least one coupling capacitor being disposed on at least one of said first and second piezoelectric substrates;

wherein each of said first and second piezoelectric filter sections comprise a pair of resonance electrodes provided on one of top and bottom major surfaces of the respective piezoelectric substrate, and a common electrode provided on the other of the top and bottom major surfaces of the respective piezoelectric substrate such that the pair of resonance electrodes and the common electrode oppose each other, and further comprising a first shield electrode provided on the major surface on which the common electrode of the first piezoelectric filter section is provided and electrically connected to the common electrode, said second piezoelectric substrate further comprises a second shield electrode provided on the major surface on which the common electrode of the second piezoelectric filter section is provided and electrically connected to the common electrode, and said first and second shield electrodes are partially not opposed to each other in the thickness direction of the first and second piezoelectric substrates.

9. A chip type piezoelectric filter, comprising:

a first piezoelectric substrate having a first piezoelectric filter section and a first coupling capacitor disposed thereon; and a second piezoelectric substrate connected to said first piezoelectric substrate and having a second piezoelectric filter section and a second coupling capacitor disposed thereon; wherein the first and second piezoelectric filter sections are electrically connected to each other via at least one of the first and second coupling capacitors, each of said first and second piezoelectric filter sections comprise a pair of resonance electrodes provided on one of top and bottom major surfaces of the respective piezoelectric substrate, and a common electrode provided on the other of the top and bottom major surfaces of the respective piezoelectric substrate such that the pair of resonance electrodes and the common electrode oppose each other, wherein the common electrodes of said first and second piezoelectric filter sections are located at an interior of an integral laminated body defined by the connected first and second piezoelectric substrates.

10. The chip type piezoelectric filter according to claim 9, wherein an input/output external electrode and an external electrode connected to the ground are provided on an outer surface of a lamination body defined by laminating said first and second piezoelectric substrates in a thickness direction thereof.

11. The chip type piezoelectric filter, according to claim 9, wherein at least one of the first and second piezoelectric substrates includes a plurality of electrodes disposed on a bottom surface thereof and a plurality of external electrodes provided on external side surfaces thereof connected to selected ones of the plurality of electrodes on the bottom surface thereof, one of the plurality of electrodes on the bottom surface having an extended portions which extends to an area located between two other electrodes of the plurality of electrodes on the bottom surface.

12. The chip type piezoelectric filter according to claim 9, wherein each of said first and second coupling capacitors comprise a pair of capacitance electrodes each provided on a respective one of top and bottom major surfaces of a respective one of said first and second piezoelectric substrates, said pair of capacitance electrodes being disposed opposite to each other with said respective one of said first and second piezoelectric substrates disposed therebetween.

13. The chip type piezoelectric filter according to claim 9, wherein said first piezoelectric substrate and said second piezoelectric substrate have temperature characteristics which are substantially the same.

14. The chip type piezoelectric filter according to claim 9, further comprising a first shield electrode provided on the major surface on which the common electrode of the first piezoelectric filter section is provided and electrically connected to the common electrode, said second piezoelectric substrate further comprises a second shield electrode provided on the major surface on which the common electrode of the second piezoelectric filter section is provided and electrically connected to the common electrode, and said first and second shield electrodes are partially not opposed to each other in the thickness direction of the first and second piezoelectric substrates.

15. The chip type piezoelectric filter according to claim 9, further comprising a pair of outer substrates each being connected to a respective one of said first and second piezoelectric substrates.

16. The chip type piezoelectric filter according to claim 9, wherein said first and second piezoelectric substrates are adapted to vibrate in a thickness longitudinal vibration mode.

\* \* \* \* \*